(12) United States Patent
Marschner et al.

(10) Patent No.: US 7,055,116 B2
(45) Date of Patent: May 30, 2006

(54) ASSERTION-BASED TRANSACTION RECORDING

(75) Inventors: Franz Erich Marschner, Ellicott City, MD (US); James M. Lawrence, Groton, MA (US); Stephen T. Ward, Tewksbury, MA (US)

(73) Assignee: Cadence Design Systems, Inc., San Jose, CA (US)

( * ) Notice: Subject to any disclaimer, the term of this patent is extended or adjusted under 35 U.S.C. 154(b) by 402 days.

(21) Appl. No.: 10/447,363

(22) Filed: May 28, 2003

(65) Prior Publication Data

US 2003/0226124 A1 Dec. 4, 2003

Related U.S. Application Data

(60) Provisional application No. 60/383,769, filed on May 28, 2002.

(51) Int. Cl.
*G06F 17/50* (2006.01)
(52) U.S. Cl. .......................................................... 716/4
(58) Field of Classification Search .................... 716/1, 716/4; 707/3–7
See application file for complete search history.

(56) References Cited

U.S. PATENT DOCUMENTS

| | | | |
|---|---|---|---|
| 6,018,735 A * | 1/2000 | Hunter | 707/5 |
| 6,338,061 B1 * | 1/2002 | Shimomura | 707/6 |
| 6,459,810 B1 * | 10/2002 | Cring | 382/229 |
| 6,785,677 B1 * | 8/2004 | Fritchman | 707/6 |
| 2001/0037421 A1 | 11/2001 | Singh et al. | |
| 2003/0200528 A1 * | 10/2003 | Li | 717/110 |

OTHER PUBLICATIONS

Patankar et al. "Formal Verification of an ARM Processor" IEEE, Jan. 10, 1999, pp. 1-6, especially section 4.
Reetz et al. "Formal Specification in VHDL for Hardware Verification" IEEE, Feb. 26, 1998, pp. 1-7, especially paragraphs 3.2, 3.3, 3.4 and 4.
International Search Report dated Mar. 23, 2004.

* cited by examiner

*Primary Examiner*—Stacy A. Whitmore
*Assistant Examiner*—Magid Y. Dimyan
(74) *Attorney, Agent, or Firm*—Bingham McCutchen LLP

(57) ABSTRACT

An assertion based transaction recording method is used to represent a signal-level transaction having a prefix and a suffix as an abstract transaction. The method models the signal-level transaction as an assertion requiring that the transaction suffix must occur following any occurrence of the transaction prefix. A finite-state-machine (FSM) implementation of the assertion records a tentative abstract transaction upon recognizing the first condition of the prefix. If the FSM recognizes that the prefix cannot complete, it cancels, or deletes, the tentative abstract transaction record. The implementation can track multiple tentative abstract transaction records that may co-exist prior to completion of the transaction prefix. Upon recognizing that the transaction prefix corresponding to the start point of the tentative abstract transaction has completed, the tentative abstract transaction record is committed. The FSM implementation of the assertion can then cancel all other outstanding tentative abstract transaction records.

20 Claims, 4 Drawing Sheets

ASSERTION-BASED TRANSACTION RECORDING

CROSS REFERENCE TO RELATED APPLICATION

This application claims the benefit of U.S. Provisional Application No. 60/383,769, filed May 28, 2002, which is hereby incorporated by reference in its entirety.

FIELD OF THE INVENTION

The present invention relates generally to the functional verification of electronic designs and more particularly to functional verification using transactions and assertions.

BACKGROUND OF THE INVENTION

Functional verification of a chip design has become more and more difficult with increasingly complex electronic designs. Attaining sufficient coverage of the design space with simulation is an ever-increasing problem. Traditional, signal-level test benches are difficult to create, maintain, and reuse. Standard mechanical coverage metrics such as line coverage and statement coverage help determine what portions of a design have not been tested at all, but they do not tell how thorough or effective testing has been for the portions that have been tested. Various techniques have been developed to improve verification coverage and provide more visibility into verification quality.

One approach is transaction-based verification, which focuses on higher-level behavior called "transactions" rather than signals as the basis for stimulation, observation, and coverage analysis. A transaction is characterized by its start and end times, the kind of operation involved, and other attributes associated with the transaction. At the abstract level, a transaction is a single transfer of high-level data or control between a Test-Bench and a design under verification (DUV), which consists of two design blocks. At the hardware level, a transaction is essentially a typically multi-cycle operation involving control and possibly data signals.

Transaction verification modules (TVMs) provide a mapping between these two views, allowing abstract transactions to be injected into the DUV, or observed as they occur within the DUV. A Master TVM and a slave TVM mediate the transfer of data between the Test-Bench and the DUV, by translating between the abstract and signal-level representations of a given transaction. The Master TVM and the Slave TVM contain transaction monitors to detect in the DUV the signal-level activity indicating the occurrence of a given signal level transaction and translating that activity to the corresponding abstract transaction, a concise representation of which can then be recorded in the simulation database. The Test-Bench monitors transactions crossing the boundary between the device and the test environment. Similarly, transactions occurring on internal buses can be detected by monitors. Transaction analysis allows verification to focus on relevant high-level behavior without getting lost in the details.

Typically, transaction-based verification and transaction-based functional coverage analysis have been driven largely by the test environment and used by verification engineers, who prefer to adopt a "black-box view" of the design in order to maximize reuse of the test environment. Transaction-based coverage analysis in this context therefore tends to focus on system-level interfaces and scenarios, and therefore on transactions between the test-bench and the DUV, and between major components of the DUV.

Another approach to functional verification of electronic designs is called assertion-based verification. Assertion-based verification is based upon an Assertion Language, which allows designers to embed information into their designs to facilitate verification. The Assertion Language allows designers to capture assumptions, specifications, and operations of a design, so that internal errors can be caught more quickly, assumptions can be checked easily, and functional blocks can be verified more easily when inserted into another design.

Assertions are built up from Boolean expressions, or conditions, which are evaluated at certain times during the execution of the design. For example, one of the simplest forms is the assertion "always C", where C is a condition; the assertion "always C" says that C must be true in each clock cycle. More complex, multi-cycle behavior can be expressed with sequences, which consist of a list of conditions that may or must be true in successive cycles, such as $c1, c2, c3, \ldots, cn$, where $c1$ through $cn$ are conditions that may or must be true in cycles $1$ through $n$.

Before a whole design can be verified, it is appropriate to verify that the major blocks function correctly with respect to their interfaces. Verifying a block often involves the block's designer, who necessarily has a "white-box" view of the design. Assertion-based verification can be used to capture and verify the designer's knowledge of the internal details of the block, and the assumptions made in its architecture and implementation.

Transaction-based verification is primarily used by verification engineers who are responsible for developing test environments for system-level verification of large designs. Assertion-based verification is primarily used by design engineers who are responsible for designing digital blocks and systems. Currently, the two tools are used independent of each other without benefiting from one another. It would be advantageous to have an improved method for functional verification of electronic designs by combining transaction-based verification and assertion-based verification using assertion-based transaction recording.

SUMMARY OF THE INVENTION

An assertion-based transaction recording method is used to represent a signal-level transaction having a prefix and a suffix as an abstract transaction. The method models the signal level transaction as an assertion requiring that the transaction suffix must occur following any occurrence of the transaction prefix. A finite-state-machine (FSM) implementation of the assertion records a tentative abstract transaction upon recognizing the first condition of the prefix. If the FSM recognizes that the prefix cannot complete, it cancels, or deletes, the tentative abstract transaction record. The implementation of the assertion can track multiple tentative abstract transaction records that may co-exist prior to completion of the transaction prefix. Upon recognizing that the transaction prefix corresponding to the start point of the tentative abstract transaction has completed, the tentative abstract transaction record is committed. The FSM implementation of the assertion can then cancel all other outstanding tentative abstract transaction records. If the suffix follows the prefix, then the committed transaction record is marked as a success. If the suffix fails to follow the prefix, then the committed transaction record is marked as a failure. The transaction record is marked as completing in the cycle in which it is marked as a success or a failure.

BRIEF DESCRIPTION OF DRAWINGS

The accompanying drawings are included to provide a further understanding of the invention and, together with the detailed description of the preferred embodiment, serve to explain the principles of the invention.

DETAILED DESCRIPTION

An assertion-based transaction recording method uses the characteristics of transactions and sequential assertions to provide a synergistic approach in which assertions can be used as embedded transaction monitors to record the internal activities of a design as abstract transactions. With this approach, existing transaction-based functional coverage analysis methods can be leveraged to use these recordings to analyze the design.

Assertion-Based Transaction Modeling

At the detailed signal level, a transaction may be thought of as a sequence of specific control signal activity, often with associated data signals. A transaction has an initial prefix that uniquely signals the beginning of the transaction, and a corresponding suffix. Once the prefix occurs, the system is expected to follow through with the suffix to complete the transaction. In some cases, the suffix may be trivially true.

An assertion in an assertion language can express quite naturally the detailed signal level activity involved in both the initiation and completion of a transaction.

A transaction may be modeled as an assertion that requires the suffix of the transaction to occur once the prefix has occurred. This includes any case in which the suffix is trivially true, and therefore always occurs once the prefix occurs. The assertion also describes in detail the signal-level activity that makes up the prefix and the suffix of the transaction.

An exemplary approach of modeling a transaction as an assertion is described below. Suppose a given protocol defines the following transaction type:

ReadOp:
   master asserts BusReq until
   arbiter asserts BusGnt; then
   master asserts Read and drives address onto system bus, then
   slave eventually responds with DataRdy, then
   master stops driving bus, and slave drives bus with data, then
      master deasserts BusReq, then
      arbiter deasserts BusGnt This transaction can be modeled as an assertion, as follows:
assert ReadOp
   after (*:BusReq, BusGnt)
   next (Read, *:!DataRdy, DataRdy, ?, !BusReq, !BusGnt);

Using sequence definitions, this could be written equivalently as:
sequence BusAcquisition (* :BusReq, BusGnt);
sequence BusRelease (!BusReq, !BusGnt);
sequence ReadCycle (Read, *:!DataRdy, DataRdy,?);
assert ReadOp
   after BusAcquisition next (ReadCycle, BusRelease);

Assertion-Based Transaction Recording

Figure 1:
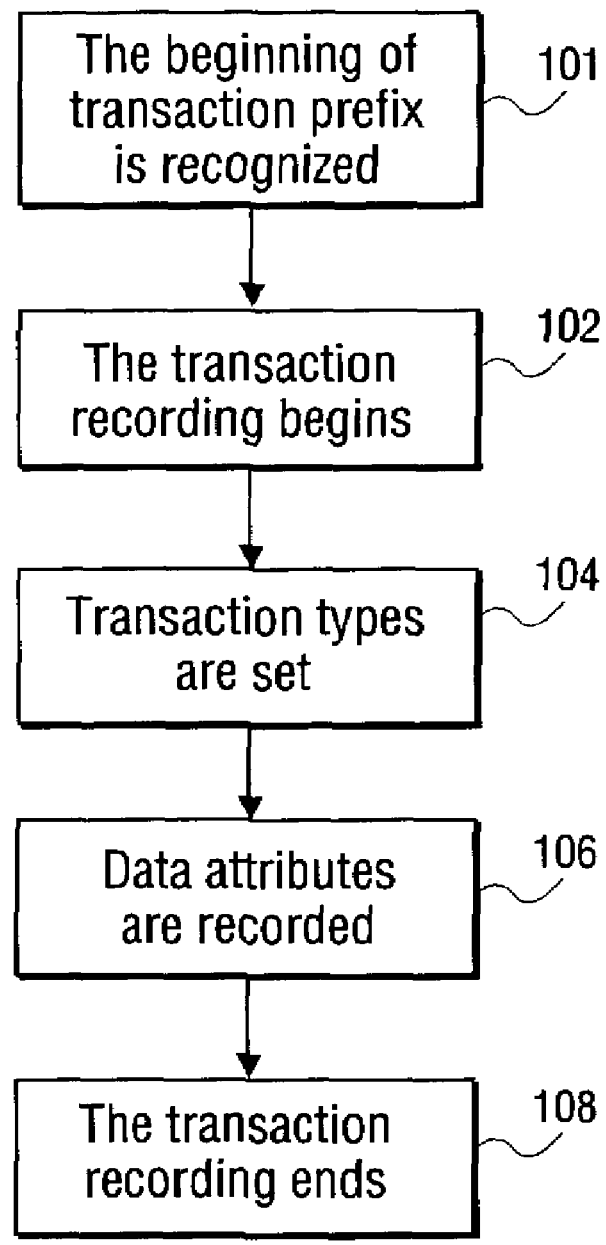
FIG. 1 shows an example of a method for assertion-based transaction recording.

FIG. 1 shows an example of a method for assertion-based transaction recording. The beginning of a transaction prefix is recognized, 101. The transaction recording begins, 102, to initiate a transaction record at the current simulation time in the database and to set its start time. Transaction types are set, 104, to indicate the transaction type of a previously initiated transaction. Data attributes are recorded, 106, to record certain data attributes of the transaction that are of interest, for example, the Address of a read operation. The transaction recording ends, 108, and commits a previously initiated transaction record and sets its end time.

Assertion-Based Transaction Recognition

Transaction recording requires recognition of occurrences of the signal-level activity comprising the transaction. This in turn requires recognition of the transaction prefix, followed by recognition of the transaction suffix.

The initial occurrence of the transaction's prefix may be non-deterministic. For example, a transaction can start in any clock cycle. The prefix of the transaction may not complete, so the commit point of the transaction may not be reached. The commit point of the transaction signals a commitment to transmit the remaining portion of the transaction. As a result, there are two corresponding characteristics of the prefix recognizer. First, the prefix recognizer must be able to start in any cycle, i.e. non-deterministically. Second, the prefix recognizer must ignore any transaction prefix that fails to complete.

The suffix of a transaction has its own characteristics. First, the suffix of the transaction must follow a successfully completed transaction prefix. Second, the suffix of the transaction is expected to complete. As a result, there are two corresponding characteristics of a suffix recognizer. First, the suffix recognizer starts deterministically, i.e. after the successful completion of the prefix of the transaction. Second, the suffix recognizer will mark the recorded transaction as either successful or failed, depending upon whether the suffix completes correctly or not.

Transaction Prefix Recognition

Figures 2A, 2B:
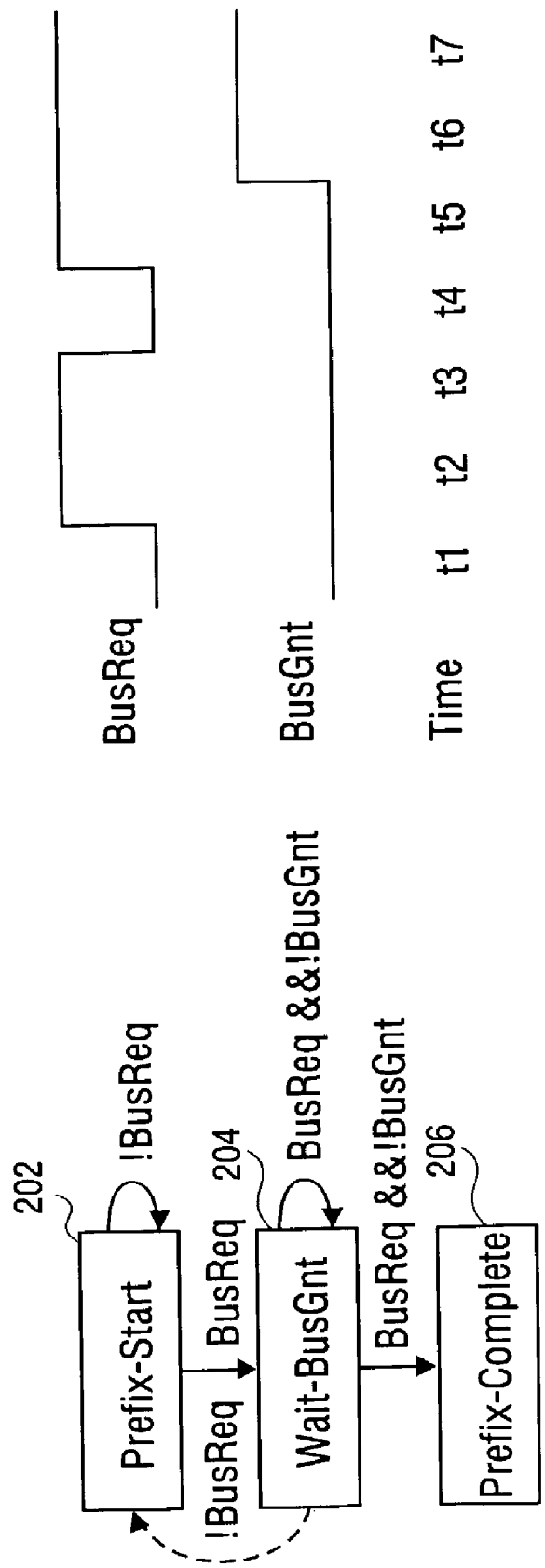
FIGS. 2a and 2b depict an approach for recognizing the prefix of a transaction.

FIG. 2a depicts one approach for recognizing the completion of a prefix of a transaction for the above ReadOp example. The ability to recognize a transaction start is a significant part of modeling the transaction as an assertion. To detect a transaction start, if the prefix of the transaction is a single condition (or a one-cycle sequence), then it can be immediately recognized as a transaction start and the beginning of the transaction is recorded. However, if the prefix of the transaction is a multi-cycle sequence, then the entire prefix is transmitted over several cycles. The last condition of the prefix therefore occurs several cycles after the initial portion. As a result, the recording of the transaction begins at the initial condition of the prefix, and the record is kept in a temporary memory location. If the complete prefix is not recognized, then the transaction record is deleted or canceled.

The finite-state-machine (FSM) used to recognize this transaction start may have three states, such as Prefix-Start 202, Wait-BusGnt 204, and Prefix-Complete 206. An example of a timing diagram of the BusReq and BusGnt functions of FIG. 2a are shown in FIG. 2b. Initially at time t0, BusReq is deasserted and the state machine stays in the Prefix-Start 202 state, waiting for the BusReq signal. At time t1, BusReq is asserted and the state machine moves to the Wait-BusGnt 204 state. At time t3, while BusReq is true and BusGnt is false, the state machine remains in the Wait-BusGnt 204 state. At t4, BusReq becomes false and this causes the state machine to return to the Prefix-Start 302 state, indicating the prefix of this transaction failed to complete. At t5, BusReq is asserted again and the state machine moves from Prefix-Start 202 state to the Wait-BusGnt 204 state. At t6, both BusReq and BusGnt are asserted, the state machine moves from Wait-BusGnt 304 state to the Prefix-Complete 306 state. Once the FSM reaches the Prefix-Complete 306 state, this marks the completion of the prefix. The Prefix-Complete state indicates that the occurrence of the complete prefix commits the design to transmit the transaction suffix.

The prefix of a transaction (in this case, {BusReq, BusGnt}), begins in any cycle in which the first condition of the prefix (in this case, BusReq) occurs. An abstract transaction will be recorded every time the prefix begins. In simulation, there is no way of knowing whether or not the transaction prefix will complete, or whether this was a false start. The actual starting point of a complete prefix can only be recognized when the whole sequence completes. Furthermore, because the conditions in the prefix may be independent variables, the prefix may appear to start multiple times before an entire prefix completes. To allow multiple outstanding prefix starts to exist, each corresponding to a possible transaction start, a begin transaction recording process 102, as shown in FIG. 1 for example, returns a unique integer identifier (ID) which can later be passed to a set transaction type process 104, to specify which deferred transaction (i.e., potential transaction starting point) corresponds to the prefix that actually completed. At that point, the specified deferred transaction is committed, and all the other deferred transactions are cancelled.

To determine the actual starting point, the integer ID returned by each begin transaction recording process is tracked by the prefix recognizer. Each time another potential match begins, the associated transaction ID is stored; as the successive terms of the sequence are seen, the ID works its way through the recognition FSM. If that candidate match turns out to be a false start, the ID is discarded; if not, it is passed to the set transaction type process, which commits the one transaction start and discards all the others. In the event that two candidate matches reach the same state in the recognition FSM (which is possible, for sequences that contain repetition), the longer candidate is kept, and the other discarded.

Once a transaction record is committed, the transaction is expected to complete through the occurrence of the suffix of the transaction.

Transaction Suffix Recognition

Figures 3A, 3B:
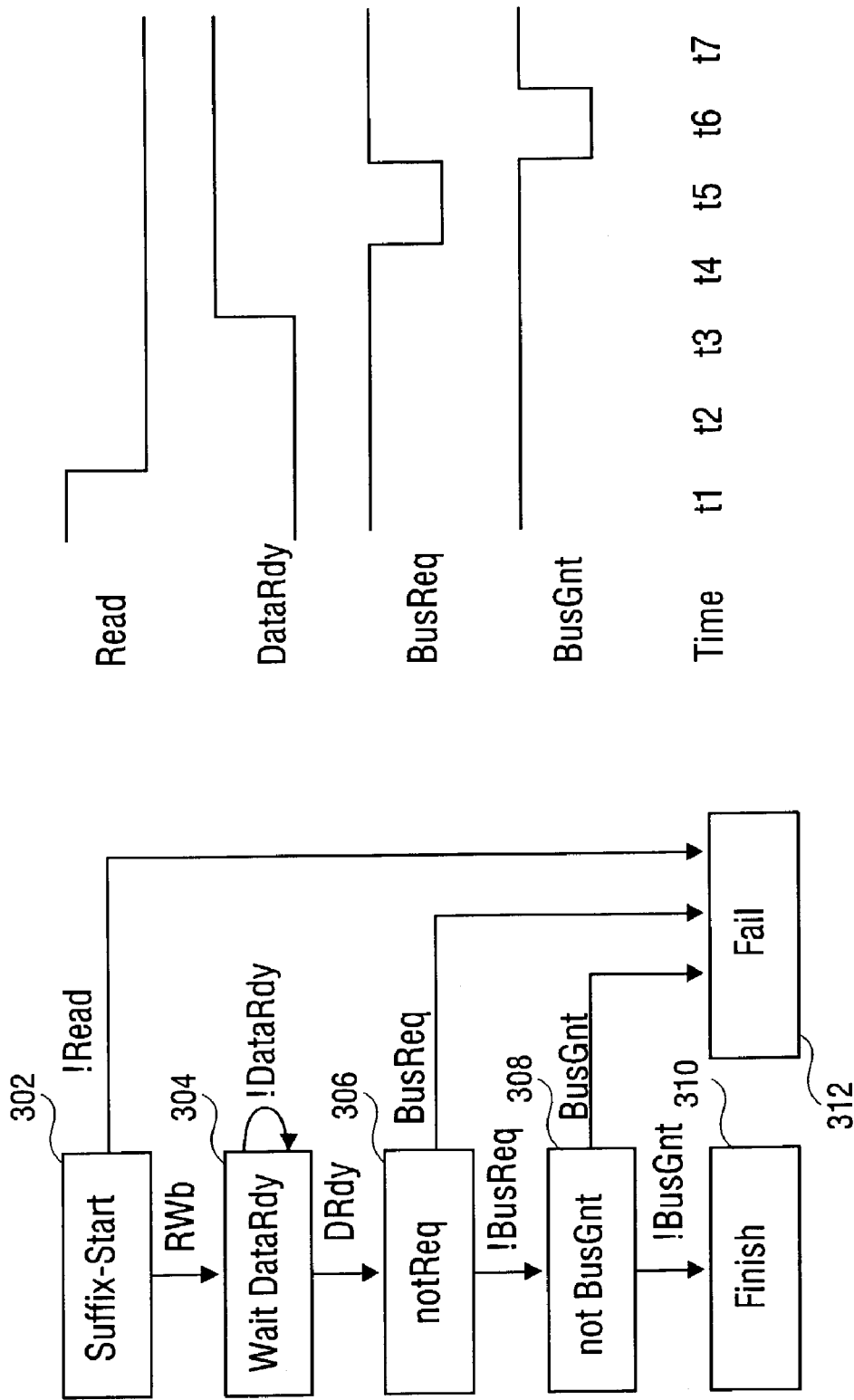
FIGS. 3a and 3b depict an approach for recognizing the suffix of a transaction.

FIGS. 3a and 3b depict one approach for recognizing the suffix of a transaction for the above ReadOp example. The finite-state-machine (FSM) as shown in FIG. 3a has 5 states: Suffix-Start 302, Wait-DataRdy 304, notReq 306, notGnt 308, Finish 310, and Fail 312. FIG. 3b shows a timing diagram of the control signals for the FSM in FIG. 3a. Initially, the FSM starts at Suffix-Start 302 state. At time t1, signal Read is asserted and the FSM moves to the Wait-DataRdy 304 state. If signal Read had not been asserted, then the FSM would have moved to the Fail 312 state. At time t2 and t3, DRdy remains to be de-asserted and the FSM remains in Wait-DataRdy 304 state. At time t4, Drdy is asserted, the FSM moves to notReq 306 state. At time t5, the control signal BusReq is de-asserted and the FSM moves to notGnt 308 state. If signal BusReq had not been de-asserted, then the FSM would have moved to the Fail 312 state. At time t6, the control signal BusGnt is de-asserted and the FSM moves to the Finish 310 state. If signal BusGnt had not been de-asserted, then the FSM would have moved to the Fail 312 state.

If the FSM reaches the Finish 310 state, the complete transaction suffix has been recognized, an end transaction recording process 108 is performed to finalize the transaction record, and the recorded transaction is marked successful. If the FSM reaches the Fail 312 state, recognition of the complete transaction suffix has failed to occur, the end transaction recording process is performed to finalize the transaction record, and the recorded transaction is marked failed.

Transaction Data Attribute Modeling and Recording

One approach to recording the data Attributes is illustrated in the following example. In a transaction, certain control signals and data signals are of interest to design and verification engineers. For instance, in the ReadOp example above, the address being read from, and the data retrieved from the address, are both aspects of the transaction. In particular, coverage analysis of transactions may involve analysis of the associated data, to ensure that verification has thoroughly addressed the data space as well as the control paths.

Data associated with a transaction can be included in an assertion model of the transaction by adding code to sample the appropriate data-carrying signals in the design in the appropriate cycles within the transaction. Sampled data may be stored in variables declared as part of the assertion. For example, the ReadOp definition given above may be extended as follows:

group ReadDefn (integer address, data)
   sequence BusAcquisition (*:BusReq, BusGnt);
   sequence BusRelease (!BusReq, !BusGnt);
   sequence ReadCycle
   (Read {address<=ibus[31:0]}, *:!DataRdy, DataRdy,
    ?{data<=ibus[15:0]});
   assert ReadOp
   after BusAcquisition next (ReadCycle, BusRelease);
end group;

During simulation, the assignment to variable 'address' would occur at the end of the cycle in which 'Read' is asserted, in order to capture the address that the bus requester (i.e., master) drives onto the bus in that cycle. Similarly, the assignment to the variable 'data' would occur at the end of the cycle after DataRdy is asserted, to capture the data returned by the read operation.

When a transaction is recorded for this extended version of the ReadOp assertion, the names and values of the variables that are assigned to during the execution of the assertion are saved in the database as attributes of the transaction. In effect, the recorded transaction is an abstraction of the detailed control signals involved in the operation, leaving only the interesting data. This greatly simplifies subsequent analysis.

Application of Assertion-Based Transaction Recording

Figure 4:
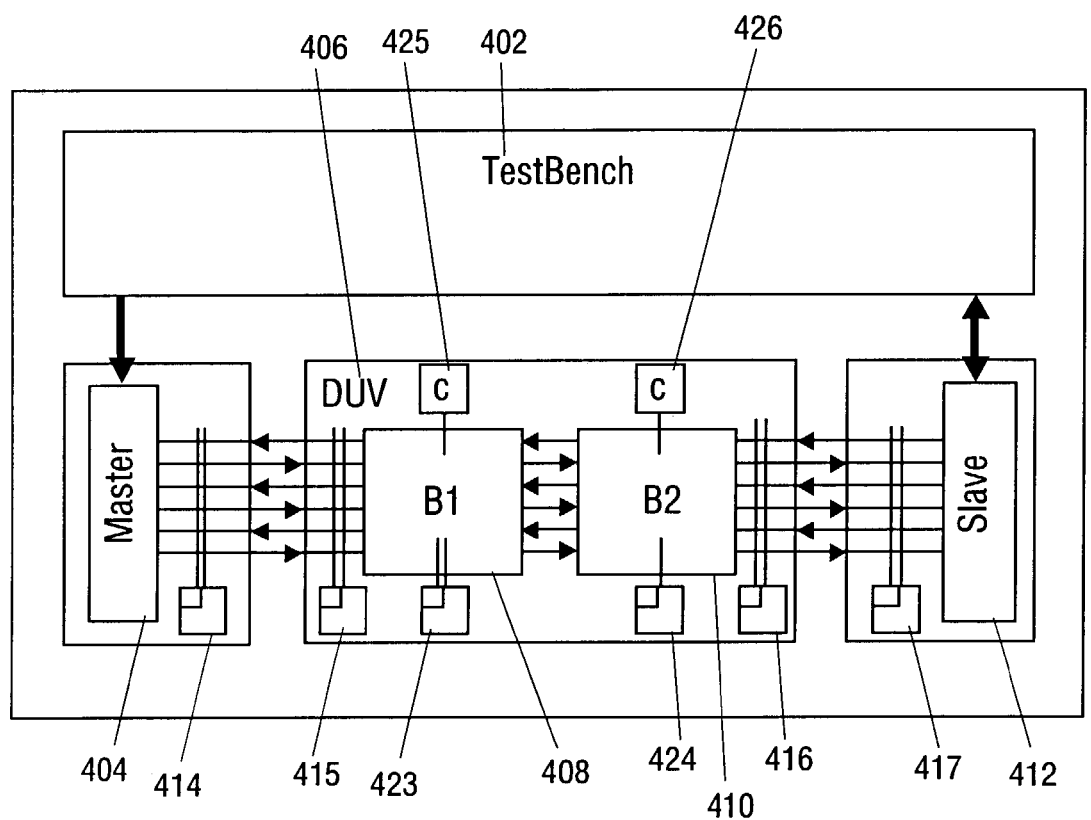
FIG. 4 depicts one approach for applying assertion-based transaction recording in a functional verification environment.

FIG. 4 depicts one approach for applying assertion-based transaction recording in a simulation environment. The system includes a TestBench 402, a Master TVM 404, a DUV 406 which is illustrated with two design blocks B1 408 and B2 410, and a Slave TVM 412. In addition, assertions are embedded to model transactions, both those occurring at the device's interfaces 414, 415, 416, 417 (e.g. bus transactions) and those occurring internally (e.g. micro-operations of the design) 423 and 424. This includes any case in which the suffix is trivially true, and therefore always occurs once the prefix occurs at coverage monitors 425 and 426.

Assertion-based transaction recording methods allow a designer to view an abstract representation of assertion activity in the context of related signals within the simulation waveform display. Also, the methods allow transaction-based coverage analysis to consider internal operations of the device together with scenario-level-transactions. In particular, functional coverage of state machine transitions, corner cases, and error preconditions become possible when internal transactions are recorded, complementing the scenario and protocol variation coverage enabled by transaction recording from TVMs. In addition, assertion-based transaction recording enables more abstract test bench design. By adopting the abstract view of a transaction, designers can create more concise test benches that are easier to maintain and reuse, for example using C++. Such abstract tests are also better suited to directed random test strategies, which combine the broad coverage of random testing with the focused results of directed testing. Functional coverage metric based on transactions provides more meaningful measurements of the quality of functional verification.

Although the invention has been described with reference to specific embodiments, it should not be construed to be so limited. Those of ordinary skill in the art can modify the claimed invention with the benefit of this disclosure without departing from the spirit of the invention. For example, modifications can be made to record the different data attributes of a transaction. Also, modifications can be made to record overlapping transactions. All of these modifications can be applied to achieve desired functional verification goals of electronic designs. These and other uses and modifications are within the spirit and scope of the present invention. Thus, the invention should not be limited by the specific examples used to illustrate it but only by the scope and content of the appended claims.

What is claimed is:

1. A method for recording an abstract transaction representing a signal-level transaction having a transaction perfix and a transaction suffix, the method comprising:
   modeling the signal level transaction as an assertion wherein the transaction suffix occurs following an occurrence of the transaction prefix;
   performing a finite-state-machine (FSM) implementation of the assertion to record a tentative abstract transaction upon recognizing the first condition of the transaction prefix;
   performing the FSM implementation of the assertion to cancel or delete the tentative abstract transaction record upon recognizing that the transaction prefix of the transaction cannot complete;
   performing the FSM implementation of the assertion to track multiple tentative abstract transaction records that may co-exist prior to completion of the transaction prefix;
   performing the FSM implementation of the assertion to commit one tentative abstract transaction record upon recognizing that the transaction prefix corresponding to a start point of the tentative abstract transaction record has completed; and
   performing the FSM implementation of the assertion to cancel other outstanding tentative abstract transaction record upon committing the one tentative abstract transaction record corresponding to the transaction prefix that has completed.

2. The method of claim 1, extended to record a status and attributes of the abstract transaction representing a signal-level transaction having the transaction prefix and the transaction suffix, the method comprising:
   performing the FSM implementation of the assertion to mark the abstract transaction record as a success upon recognizing that the transaction suffix has completed following the transaction prefix;
   performing the FSM implementation of the assertion to mark the abstract transaction record as a failure upon recognizing that the transaction suffix either does not start immediately following the transaction prefix, or that after starting, it cannot complete;
   performing the FSM implementation of the assertion to record data values sampled during recognition of the transaction prefix and the transaction suffix as values of the attributes of the abstract transaction record;
   performing the FSM implementation of the assertion to complete the abstract transaction record that has been marked as a success or a failure and store it in a simulation database.

3. An apparatus for recording an abstract transaction representing a signal-level transaction having a transaction prefix and a transaction suffix, the apparatus comprising:
   means for modeling the signal level transaction as an assertion wherein the transaction suffix occurs following an occurrence of the transaction prefix;
   means for performing a finite-state-machine (FSM) implementation of the assertion to record a tentative abstract transaction upon recognizing the first condition of the transaction prefix;
   means for performing the FSM implementation of the assertion to cancel or delete the tentative abstract transaction record upon recognizing that the transaction prefix of the transaction cannot complete;
   means for performing the FSM implementation of the assertion to track multiple tentative abstract transaction records that may co-exist prior to completion of the transaction prefix;
   means for performing the FSM implementation of the assertion to commit one tentative abstract transaction record upon recognizing that the transaction prefix corresponding to a start point of the tentative abstract transaction record has completed; and
   means for performing the FSM implementation of the assertion to cancel other outstanding tentative abstract transaction record upon committing the one tentative abstract transaction record corresponding to the transaction prefix that has completed.

4. The apparatus of claim 3, extended to record a status and attributes of the abstract transaction representing the signal-level transaction having the transaction prefix and the transaction suffix, the apparatus comprising:
   means for performing the FSM implementation of the assertion to mark the abstract transaction record as a success upon recognizing that the transaction suffix has completed following the transaction prefix;
   means for performing the FSM implementation of the assertion to mark the abstract transaction record as a failure upon recognizing that the transaction suffix either does not start immediately following the transaction prefix, or that after starting, it cannot complete;
   means for performing the FSM implementation of the assertion to record data values sampled during recognition of the transaction prefix and the transaction suffix as values of the attributes of the abstract transaction record;

means for performing the FSM implementation of the assertion to complete the abstract transaction record that has been marked as a success or a failure and store it in a simulation database.

5. A computer readable medium storing a computer software program for recording an abstract transaction representing a signal-level transaction having a transaction prefix and a transaction suffix, which, when executed by a processing system, causes the processing system to perform a method comprising:

modeling the signal level transaction as an assertion wherein the transaction suffix occurs following an occurrence of the transaction prefix;

performing a finite-state-machine (FSM) implementation of the assertion to record the tentative abstract transaction upon recognizing the first condition of the transaction prefix;

performing the FSM implementation of the assertion to cancel or delete a tentative abstract transaction record upon recognizing that the prefix of the transaction cannot complete;

performing the ESM implementation of the assertion to track multiple tentative abstract transaction records that may co-exist prior to completion of the transaction prefix;

performing the FSM implementation of the assertion to commit one tentative abstract transaction record upon recognizing that the transaction prefix corresponding to a start point of the tentative abstract transaction record has completed; and performing the FSM implementation of the assertion to cancel other outstanding tentative abstract transaction record upon committing the one tentative abstract transaction record corresponding to the transaction prefix that has completed.

6. The medium of claim 5, wherein the computer software program, when executed by the processing system, causes the system to perform the method further comprising:

performing the FSM implementation of the assertion to mark the abstract transaction record as a success upon recognizing that the transaction suffix has completed following the transaction prefix;

performing the FSM implementation of the assertion to mark the abstract transaction record as a failure upon recognizing that the transaction suffix either does not start immediately following the transaction prefix, or that after starting, it cannot complete;

performing the FSM implementation of the assertion to record data values sampled during recognition of the transaction prefix and the transaction suffix as values of attributes of the abstract transaction record;

performing the FSM implementation of the assertion to complete the abstract transaction record that has been marked as a success or a failure and store it in a simulation database.

7. A method for recording an abstract transaction representing a signal-level transaction having a transaction prefix and a transaction suffix, the method comprising:

modeling the signal level transaction as an assertion in which the transaction suffix occurs after an occurrence of the transaction prefix; and recording the abstract transaction based upon a finite state machine (FSM) implementation of the assertion.

8. The method of claim 7, further comprising:
recognizing a transmission of the transaction prefix; and
recording a tentative abstract transaction.

9. The method of claim 8, further comprising:
recognizing a failure of the transaction prefix to complete; and
deleting the tentative abstract transaction record.

10. The method of claim 8, further comprising:
recognizing that the transmission of the transaction prefix has completed; and
committing the corresponding tentative abstract transaction record.

11. The method of claim 10, further comprising:
before recognizing the completed transmission, tracking a plurality of additional tentative abstract transaction records, each additional tentative abstract transaction record corresponding to one of a plurality of additional transactions; and
after recognizing the completed transmission, canceling the plurality of additional tentative abstract transaction records.

12. The method of claim 10, further comprising:
recording a status and attributes of the abstract transaction representing the signal-level transaction having the transaction prefix and the transaction suffix.

13. The method of claim 12, wherein recording the status further comprises: recognizing that a transmission of the transaction suffix of the transaction has completed; and marking the abstract transaction record as a success.

14. The method of claim 12, wherein recording the status further comprises: recognizing a failure of the tranaction suffix to complete a transmission; and marking the abstract transaction record as a failure.

15. The method of claim 12, wherein recording attributes further comprises:
recording data values sampled during recognition of the transaction prefix and transaction suffix of the transaction as values of the attributes of the abstract transaction record.

16. The method of claim 10, further comprising:
storing the committed abstract transaction record in a circuit simulation database.

17. A computer readable medium storing a computer software program which, when executed by a processing system, causes the processing system to perform a method for recording an abstract transaction representing a signal-level transaction having a transaction prefix and a transaction suffix, the method comprising:

modeling the signal level transaction as an assertion in which the transaction suffix occurs after an occurrence of the transaction prefix; and recording the abstract transaction based upon a finite state machine (FSM) implementation of the assertion.

18. The medium of claim 17, wherein the program, when executed, causes the system to perform the method further comprising:

recognizing a transmission of the transaction prefix; and
recording a tentative abstract transaction.

19. An apparatus comprising:
means for modeling signal level transaction as an assertion which a transaction suffix occurs after an occurrence of transaction prefix; and means for recording an abstract transaction representing the signal-level transaction having the prefix and the suffix; and means for recording the abstract transaction based upon a finite state machine (FSM) implementation of the assertion.

20. The apparatus of claim 19, further comprising:
means for recognizing a transmission of the transaction prefix; and
means for recording a tentative abstract transaction.

* * * * *